United States Patent [19]
Yamaguchi

[11] Patent Number: 5,448,574
[45] Date of Patent: Sep. 5, 1995

[54] DETECTION SYSTEM FOR ABNORMAL CABLE CONNECTIONS IN COMMUNICATION APPARATUSES

[75] Inventor: Masaru Yamaguchi, Tokyo, Japan

[73] Assignee: NEC Corporation, Tokyo, Japan

[21] Appl. No.: 389,745

[22] Filed: Feb. 15, 1995

Related U.S. Application Data

[63] Continuation of Ser. No. 840,061, Feb. 21, 1992, abandoned.

[30] Foreign Application Priority Data

Feb. 21, 1991 [JP] Japan .................................. 3-026988

[51] Int. Cl.$^6$ .......................................... G06F 11/00
[52] U.S. Cl. .................................. 371/20.1; 371/204; 324/66
[58] Field of Search ................... 371/15.1, 20.1, 20.3, 371/20.4; 324/66

[56] References Cited

U.S. PATENT DOCUMENTS

| | | | |
|---|---|---|---|
| 3,976,939 | 8/1976 | Cruce et al. | |
| 4,325,022 | 4/1982 | Pelletien | 324/52 |
| 4,498,716 | 2/1985 | Ward | 371/22 |
| 4,620,282 | 10/1986 | Shelley | 324/66 |
| 4,713,810 | 12/1987 | Chum | 371/4 |
| 4,794,339 | 12/1988 | LeNiiz et al. | 324/540 |
| 4,983,884 | 1/1991 | Wychulis | |
| 5,027,074 | 6/1991 | Haferstat | 324/66 |
| 5,151,902 | 9/1992 | Grallert | 371/51 |
| 5,170,113 | 12/1992 | Albonesi | 324/66 |

FOREIGN PATENT DOCUMENTS

| | | | |
|---|---|---|---|
| 2826097 | 12/1979 | Germany | G01R 31/02 |
| 3924763 | 7/1991 | Germany | G01R 31/02 |
| 2245713 | 1/1992 | United Kingdom | G01R 31/02 |

*Primary Examiner*—Robert W. Beausoliel, Jr.
*Assistant Examiner*—Albert DeCady
*Attorney, Agent, or Firm*—Whitham, Curtis, Whitham & McGinn

[57] ABSTRACT

In a communication apparatus in which a first level unit, a second level unit and a third level unit are hierarchically arranged and these units are connected to one another by multicore cables, one of the many cores of each multicore cable is used as monitoring core, and the first level unit sends out to each monitoring core a probe signal generated by sampling the digital signals supplied via the individual cores of the multicore cable and multiplexing them on a time-division basis. The second level unit compares each of these probe signals and a string of signal samples supplied via the multicore cable corresponding to this probe signal, generates a faulty connection indicating signal in response to any discrepancy between them; generates, similarly to the first level unit, a probe signal for detecting any faulty connection between the second level and third level units; multiplexes these signals on a time-division basis; and inserts the multiplexed signal into the monitoring core to the third level unit. The third level unit, on the basis of the probe signal for this signal supplied via the monitoring core, can display a faulty connection signal both for each multicore cable and for each individual core.

12 Claims, 5 Drawing Sheets

DETECTION SYSTEM FOR ABNORMAL CABLE CONNECTIONS IN COMMUNICATION APPARATUSES

This is a continuation of application Ser. No. 07/840,061, filed Feb. 21, 1992, now abandoned.

BACKGROUND OF THE INVENTION

1. Field of the Invention

The present invention relates to a system to detect abnormal cable connections in communication apparatuses, and more particularly to an apparatus to detect any such abnormality as a faulty connection of cables or a cable disconnection in such an apparatus as a carrier terminal apparatus, a repeater apparatus or a node station apparatus for an ATM transfer network.

2. Description of the Prior Art

When line trouble occurs between a pair of mutually opposite communication apparatuses or in a communication system involving a plurality of repeater apparatuses arranged in cascade, the point of trouble occurrence is located by various methods. If the trouble is on a submarine relay line or a long-distance relay line, signals of a prescribed bit pattern are sent from the transmit terminal station, and their reflected wave is detected to measure the distance from the terminal station to the trouble spot and thereby to locate the trouble. Similarly, signals of said bit pattern from the transmit terminal station are detected by each repeater station to detect any trouble in any other repeater station on the way or on the line between repeater stations.

If any repeater station or repeater apparatus is identified as a trouble spot by the above described method, many constituent units of the repeater apparatus or the like (usually in packages, each consisting of a printed circuit board mounting many electronic parts) are tested in a prescribed procedure, and the constituent unit involving the part which caused the trouble is replaced with a new one to restore the line.

Trouble-shooting techniques for repeater apparatuses or the like on a unit-by-unit basis have made significant progress, and many testing apparatuses for that purpose are commercially available, but there remains an area in which no matching progress has been achieved as yet. It is the detection of connection trouble with a multicore cable or a connector between various functional units, i.e. the detection of trouble due to a cable disconnection or the faulty contact of a connector.

Usually, such a repeater apparatus or the like consists of a rack divided into a plurality of subracks and a plurality of functional units plugged into each of these subracks. Each such functional unit (hereinafter referred to simply as "unit") involves one or more packages, each consisting of a printed circuit board mounting LSIs and other parts. To the back face of each subrack is fixed a wiring back board, and on the surface of the board is printed the wiring between the many packages to be plugged into the subrack.

Whereas the connection among the units (or packages) to be accommodated by a subrack is thus formed by a wiring back board, that among units on two or more subracks (inter-subrack unit-to-unit connection) has to rely on a multicore cable or cables. Moreover, since the large number of units in such a repeater apparatus or the like are hierarchically grouped from the lower to the upper level because of the nature of transmitted signals, which are frequency-division or time-division multiplexed, and subracks are assigned according to the level in the hierarchy, the number of inter-subrack unit-to-unit connections tends to become great, and so does that of multicore cables accordingly.

At least one end (usually both ends) of each of these many multicore cables is connected by a connector. Therefore, not only the quality of each of these multicore cables and that of the cable-to-connector connection but also the state in which the connector is mounted affects the operation of the apparatus. In spite of the risk these constituent parts entail, no repeater apparatus or the like according to the prior art is provided with means to detect connection trouble with said multicore cables and connectors forming inter-subrack unit-to-unit connections. As a consequence, once any line trouble due to a faulty connection of said multicore cable and connector occurs, it takes a long time to restore normal line connection.

BRIEF SUMMARY OF THE INVENTION

Object of the Invention

An object of the present invention, therefore, is to provide a system which can readily, and yet without adversely affecting the manufacturing cost, achieve the detection of cable connection trouble in a communication apparatus.

SUMMARY OF THE INVENTION

The detection system for abnormal cable connection in a communication apparatus according to the invention uses one of the individual cores of each of the many multicore cables forming said inter-subrack unit-to-unit connections as a connection monitoring signal transmission path (monitoring core). A first unit in this system is provided with means to sample for a prescribed duration digital signals transferred in parallel over those cores from said first unit belonging to said lower level to a second unit belonging to an upper level and to extract a probe signal, which results from the time-division multiplexing of the sampled signals, and this probe signal is transferred to said second unit over said monitoring core in parallel with said digital signals being transferred in parallel.

In the second unit, said digital signals and the probe signal supplied via the monitoring core, both transferred in parallel, are compared bit by bit and, upon detection of any discrepancy between the two kinds of signals, an indication of faulty connection is issued. If the connections between this plurality of cores including the monitoring core and connectors are strictly tested in advance by a conventional technique, said bit-by-bit comparison of transferred digital signals can be dispensed with for said individual cores except the monitoring core. In this case, any faulty connection in the multicore cable can be detected by feeding a prescribed D.C. voltage for the monitoring purpose to said monitoring core in said first unit and detecting the monitoring D.C. voltage in said second unit.

As described above, according to the present invention, one of the cores of each multicore cable for inter-subrack unit-to-unit connection is used as a monitoring core, a probe signal representing the connected state of individual cores or the multicore cable is transferred over this monitoring core from said first unit to said second unit, and the presence or absence of faulty connection is detected by the second unit on the basis of the state of digital signals transferred over that monitoring core. Therefore, unlike by similar apparatuses according to the prior art, any faulty connection can be accurately detected without requiring any additional constituent element.

BRIEF DESCRIPTION OF THE PRIOR ART

The above-mentioned and other objects, features and advantages of the present invention will become more apparent from the following detailed description when taken in conjunction with the accompanying drawings, wherein.

DETAILED DESCRIPTION OF THE PREFERRED EMBODIMENT

Next will be described a preferred embodiment of the present invention with reference to the drawings.

Figure 1:
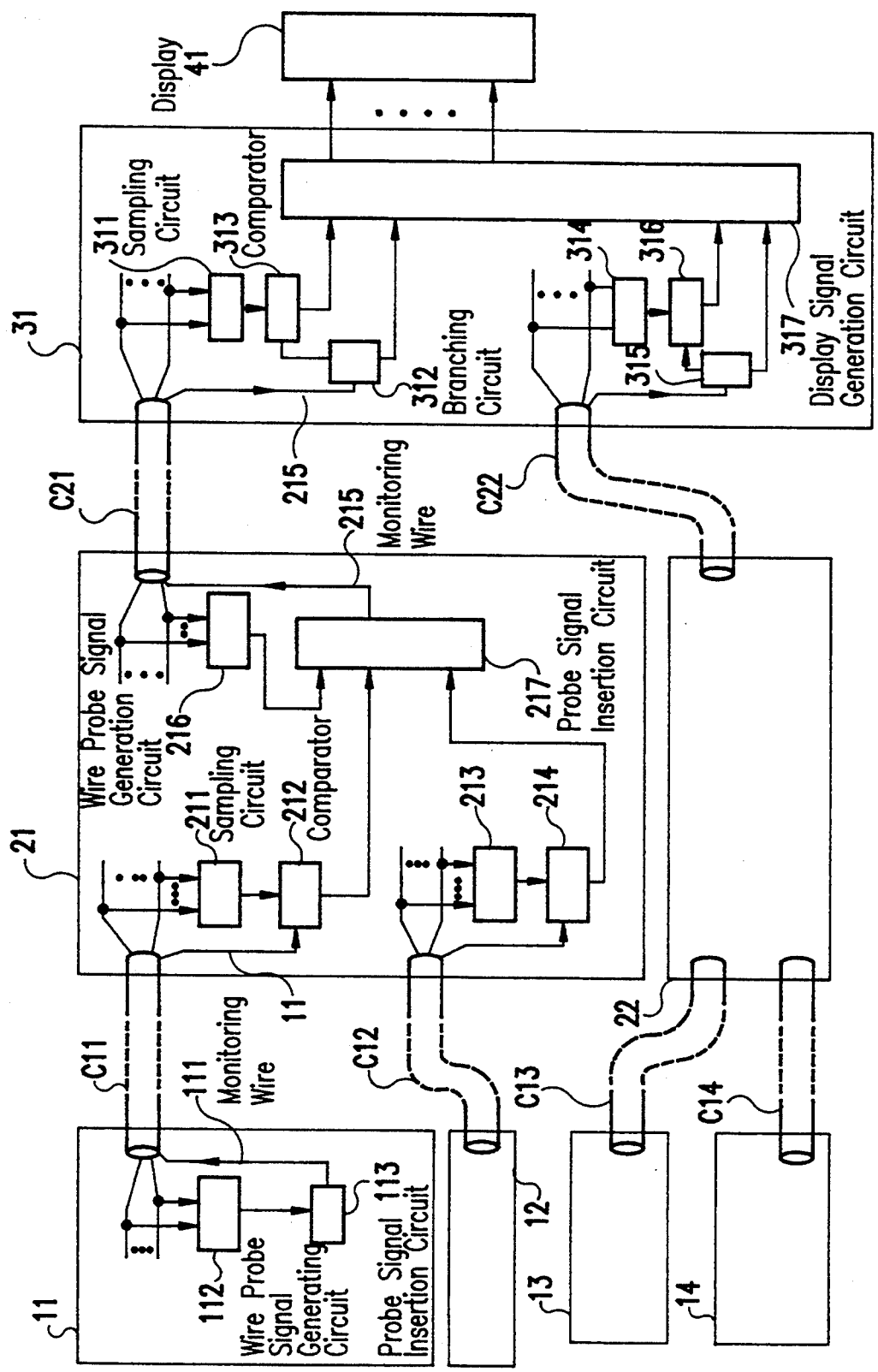
FIG. 1 is a block diagram of a preferred embodiment of the invention.

Referring first to FIG. 1 which is a block diagram of the preferred embodiment of the invention, this detection system for faulty cable connection is provided with four first level units 11 through 14; a first second level unit 21 which receives the supply of a plurality of digital signals from the units 11 and 12 over multicore cables C11 and C12, respectively; a second second level unit 22 which receives the supply of a plurality of digital signals from the units 13 and 14 over multicore cables C13 and C14, respectively; a third level unit which receives the supply of a plurality of digital signals from these first and second level units 21 and 22 over multicore cables C21 and C22, respectively; and a display unit 41 for displaying any faulty connection detection output from the unit 31.

The unit 11 is further provided with a core probe signal generating circuit 112 which receives the supply of said plurality of digital signals transferred in parallel over the whole plurality of cores of the multicore cable C11 but a core 111 which constitutes the monitor core, and extracts a core probe signal formed by time-division multiplexing of those digital signals by scanning them in a prescribed monitor frame period with a sampling pulse having a prescribed width, and a probe signal inserting circuit 113 for supplying this core probe signal to the monitoring core 111 at a prescribed timing.

This probe signal inserting circuit 113 also inserts in a time sharing manner a cable probe signal for detecting the connected state of the cable C11 on a whole cable basis. The constituent elements of the units 12, 13 and 14 are similar to the above-described constituent elements of the unit 11, and accordingly their illustration is dispensed with.

The second level unit 21 is provided with a sampling circuit 211 for generating a string of digital signal samples in the same sequence as that of said core probe signal generating circuit 112 by sampling, synchronously with said core probe signal, said plurality of digital signals transferred in parallel over the cores of the multicore cable C11 other than said monitoring core 111; a comparator circuit 212 for comparing bit by bit the string of digital signal samples with said core probe signal supplied via the monitoring core 111; another sampling circuit 213 and another comparator circuit 214, both connected to the cable C12 and respectively having the same configurations as said circuits 211 and 212; a core probe signal generating circuit 216, similar to said generating circuit 112, for generating a time-division multiplexing core probe signal from a plurality of digital signals transferred in parallel over the cores of the cable C21 other than the monitoring core 215; and a probe signal inserting circuit 217 for sending out to the monitoring core 215, in a time-division multiplexing manner and the outputs of said comparator circuits 212 and 214, the core probe signal from said circuit 216 for detecting any faulty connection of the whole cable C21. The configuration of the other second level unit 22 is similar to the that of said unit 21, and accordingly its illustration is dispensed with.

The third level unit 31, which receives the outputs of these second level units 21 and 22 over the cables C21 and 22, respectively, involves a sampling circuit 311 for generating a string of digital signal samples by sampling, synchronously with the core probe signal supplied via said monitoring core 215, a plurality of digital signals transferred in parallel from the unit 21 over the cores of the multicore cable C21 other than the monitoring core; a branching circuit 312 for separating the comparison outputs of said comparator circuits 212 and 214 transferred in a time sharing manner; and a comparator circuit 313 for comparing bit by bit core probe signals from this branching circuit and said string of samples. The branching circuit 312 is means to realize in a time sharing manner the bit-by-bit comparison in the comparator circuit 313 for three core probe signals from the cables C11, C12 and C21. Similarly, the unit 31 is provided with a sampling circuit 314, a branching circuit 315 and a comparator circuit 316 for a plurality of digital signals and probe signals transferred in parallel from the unit 22 over the cores of the multicore cable C22.

The branching circuit 315, too, like the above-described branching circuit 312, is means to realize in a time sharing manner the bit-by-bit comparison in the comparator circuit 316 for three core probe signals from the cables C13, C14 and C22. The outputs of the comparator circuits 313 and 316 and the other outputs of the branching circuits 312 and 315 (i.e. the core probe signals from the units 21 and 22) are supplied to the display unit 41 via an indicating signal generating circuit 317 comprising a serial-to-parallel converting circuit for indicating the detection of any faulty connection core by core and cable by cable.

As long as the plurality of digital signals transferred in parallel over the cable C11 are normal, the output of the comparator for comparing said string of samples of those digital signals and the core probe signal supplied via the monitoring core 111 remains "0". If any discrepancy arises between them, the comparator circuit 212 will give an output of "1", which is sent to the display unit 41 via the inserting circuit 217, the monitoring core 215 of the cable C21, the branching circuit 312 and the converting circuit 317. The output of the other comparator circuit 214 of the unit 21 and those of two opposite comparator circuits (not shown) involved in the unit 22 are also sent to the display unit 41 via the cable C21 in a time sharing manner with the output of said comparator circuit 212. The same is true with the opposite comparator circuits of the second unit 22. In this way any faulty connection on any of the cables C11 through C14, C21 and C22 is indicated on the display unit 41 immediately upon occurrence. It is generally evident to persons skilled in the art that the display unit 41 can be composed of a latching circuit for holding the pulse indicating any faulty connection and a usual display element such as a pilot lamp or an LCD, and its detailed description is therefore dispensed with. The widths and periods (frame lengths) of the sampling pulses in the sampling circuits 211, 213, 311, 314 and so forth can be selected independently of the bit rate of the digital signals transferred over individual cable cores. Since it is rare for the connected state of each individual cable core or of a whole cable to vary in a short period of time, it is usual to select 10 to 100 microseconds for said pulse width and a value more than 50 times the pulse width for the frame length, the number of cores being assumed to be 50.

Figure 2:
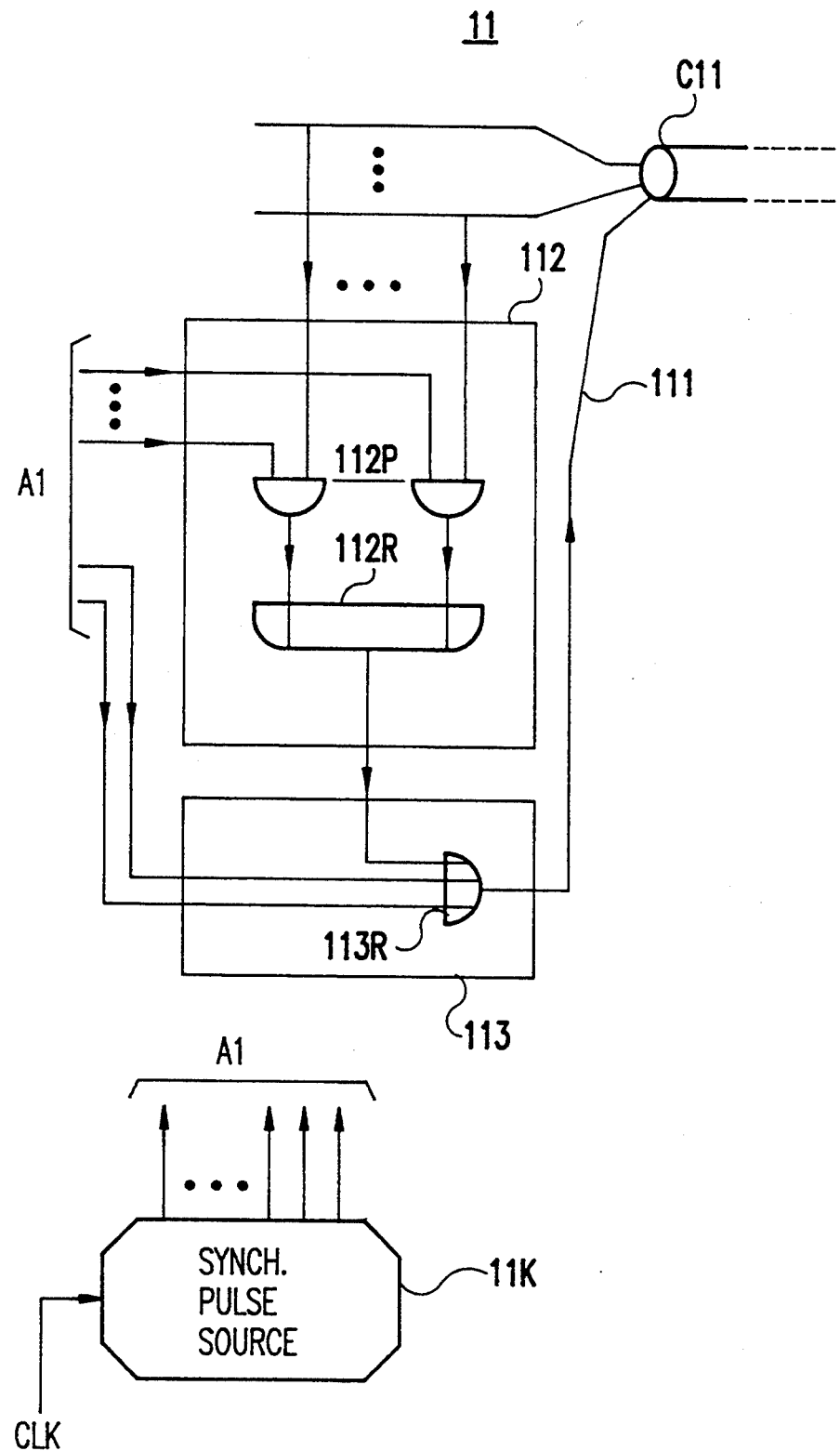
FIG. 2 is a circuit diagram of a part of the embodiment illustrated in FIG. 1.

Referring next to FIG. 2, which is a circuit diagram illustrating the constituent elements of the unit 11, this unit 11 is provided with a synchronization pulse source 11K, which receives the supply of a clock pulse CLK, for generating a plurality of pulses which are ON for a period equal to the width of said sampling pulse in mutually staggered positions, i.e. channel pulses, a cable probe pulse for detecting any faulty cable connection, and a frame synchronization pulse to be described in further detail below. The core probe signal generating circuit 112 is provided with an AND circuit group 112 consisting of 50 AND circuits, each of which having one of its input terminals connected to one of the 50 cores of the cable C11 other than the monitoring core 111 and the other connected to a plurality of output terminals of said synchronization pulse source 11K matching said channel pulses, and an OR circuit 112R for generating the logical sum of the outputs of these AND circuits. Meanwhile, the probe signal inserting circuit 113 receives the supply of said cable probe pulse and frame synchronization pulse from the synchronization pulse source 11K and the output of the OR circuit 112R, and sends out the logical sum of these signals to the monitoring core 111.

The widths of said channel pulses, cable probe pulse and frame synchronization pulse are selected from the range of 10 to 100 microseconds, and the time length of a frame accordingly is between 520 and 5200 microseconds.

The circuit configuration of the unit 11 illustrated in FIG. 2 is shared by the other first level units 12 through 14, and therefore a detailed description of their circuit configurations is dispensed with.

Figure 3:
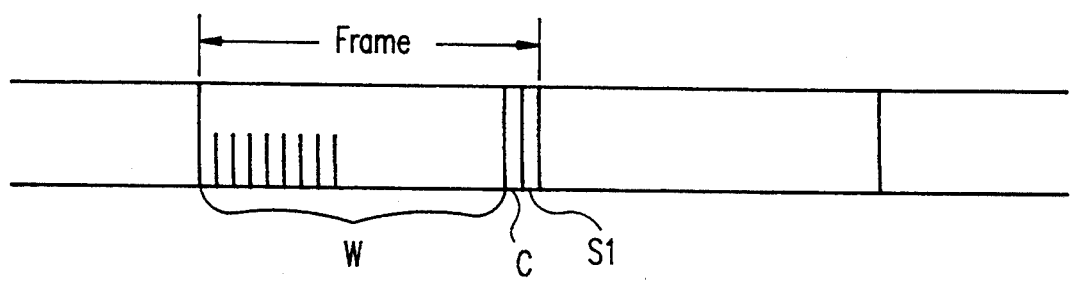
FIG. 3 is a diagram illustrating the frame composition of a signal at a specific point in FIG. 1.

As described above, referring to FIG. 3 illustrating the arrangement of the probe signal and the frame synchronization signal, which are time-division multiplexed and sent out on the monitoring core 111 (FIG. 2), on the time axis, this probe signal has 52 time slots having the same pulse width as the above-mentioned sampling pulse in each frame. The 1st through 50th time slots W are allocated for core probe signals, the 51st time slot C, for the cable probe signal, and the 52nd time slot S1, for the frame synchronization signal. The transfer of such whole frames is repetitively accomplished either consecutively or intermittently. The time slots are similarly allocated in the other first level units 12, 13 and 14, respectively connected to the cables C12, C13 and C14.

Figure 4:
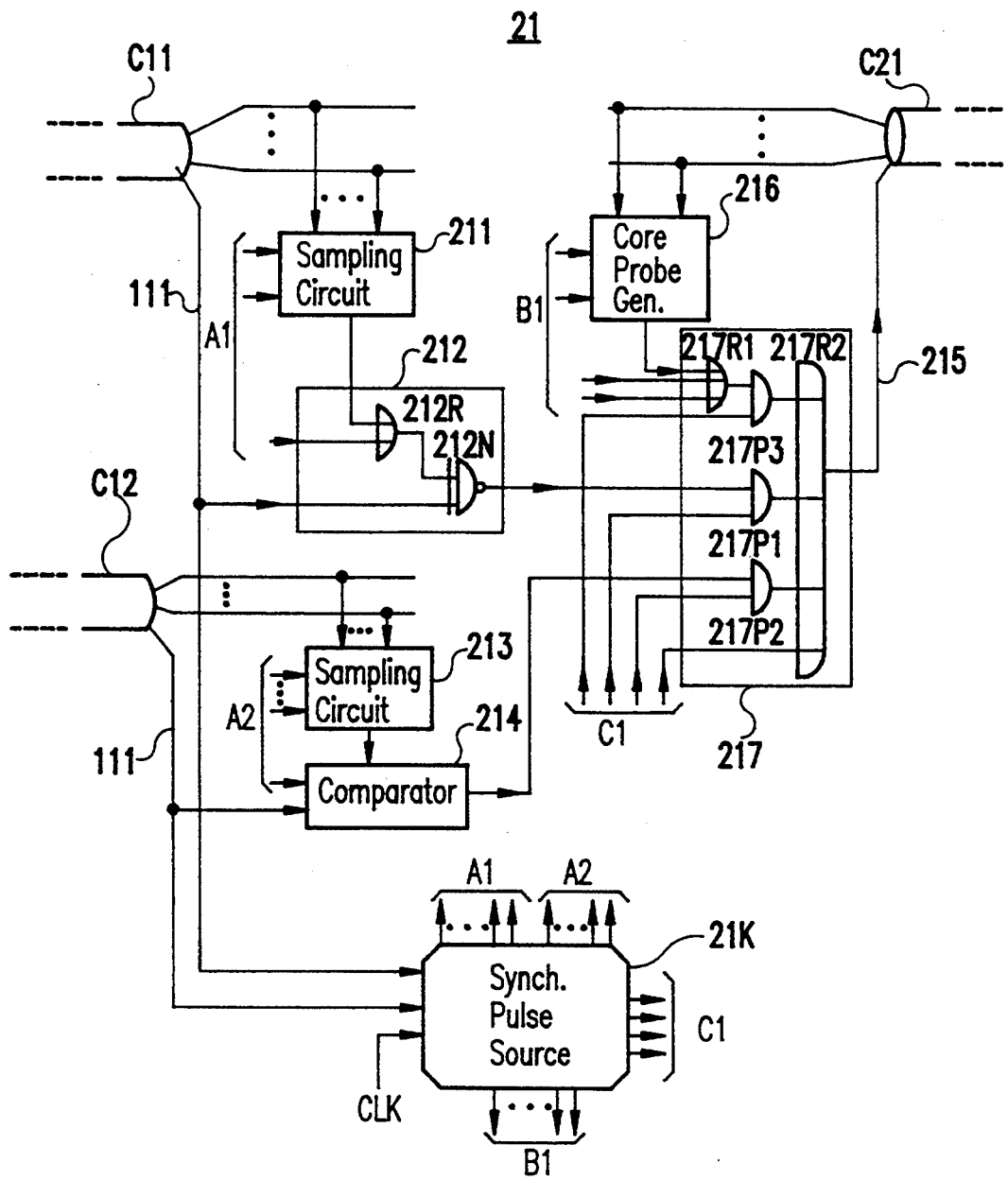
FIG. 4 is a circuit diagram of another part of the embodiment illustrated in FIG. 1.

Referring now to FIG. 4 which is a circuit diagram of the constituent elements of the second level unit 21, this unit 21 is provided with a synchronization pulse source 21K which is responsive to said frame synchronization signal and the clock pulse coming via the cable C11 and C12 for generating a series of synchronization pulses including receive side channel pulses A1 and A2. There are 51 receive side channel pulses A1 per frame, which control the generation of said string of digital signal samples in the sampling circuit 211 and the bit-by-bit comparison in the comparator circuit 212 consisting of an OR circuit 212R and an EX-NOR circuit 212N. The configurations of the sampling circuit 213 and the comparator circuit 214 matching the cable C12, both controlled by the other receive side channel pulses A2 (51 such pulses per frame like A1) are the same as those of the above-described circuit 211 and comparator circuit 212, respectively, and accordingly are not detailed here.

In these comparator circuits 212 and 214, when both of the two inputs to the EX-NOR circuits 212N and 214 are "0" or "1", the resultant outputs are "0", and when one of the inputs is "0" and the other is "1", the outputs are "1". Therefore, in the absence of faulty connection on the cable C11 and C12, both outputs remain "0". If any one of the cores of the cable C11 is broken, the output of the sampling circuit 211, as the time slot corresponding to the broken core lacks a signal though there is nothing abnormal in the signal on the monitoring core 111, will indicate faulty connection, with the output of the EX-NOR circuit 212N turning "1" at that time slot. If any one of the cores of the cable C12 is broken, the output of the comparator circuit 214 will similarly indicate abnormality. The outputs of these comparator circuits 212 and 214 are supplied to one each of the input terminals AND circuits 217P1 and 217P2, whose other input terminals receive transmit side channel pulses C1 from said synchronization pulse source 21K.

Meanwhile the core probe signal generating circuit 216 (whose circuit diagram is dispensed with because it has the same configuration as the circuit 112 illustrated in FIG. 2), whose input terminals are connected to the 30 cores of the output side cable C21, performs sampling under the control of output side channel pulses B1 from the synchronization pulse source 21K, generates core probe signals consisting of a string of digital signal samples, and supplies the core probe signals to an AND circuit 217P3 via one of the input terminals of a three-input OR circuit 217R1 of the probe signal inserting circuit 217. Two other input terminals of the OR circuit 217R1 are respectively supplied with the cable probe signal for detecting any faulty connection on the whole cable C21 and the final two of said transmit channel pulses B1 as frame synchronization pulses for synchronization with the third level unit 31. The outputs of said AND circuits 217P1, 217P2 and 217P3 are fed, together with a frame synchronization pulse from a synchronization pulse source 32K, to the monitoring core 215 of the cable C21 via an OR circuit 217R2.

The circuit configuration of the constituent elements of the second level unit 21, described above with reference to FIG. 4, is shared by the other second level unit 22, and the description of the latter's configuration is therefore dispensed with.

Figure 5:
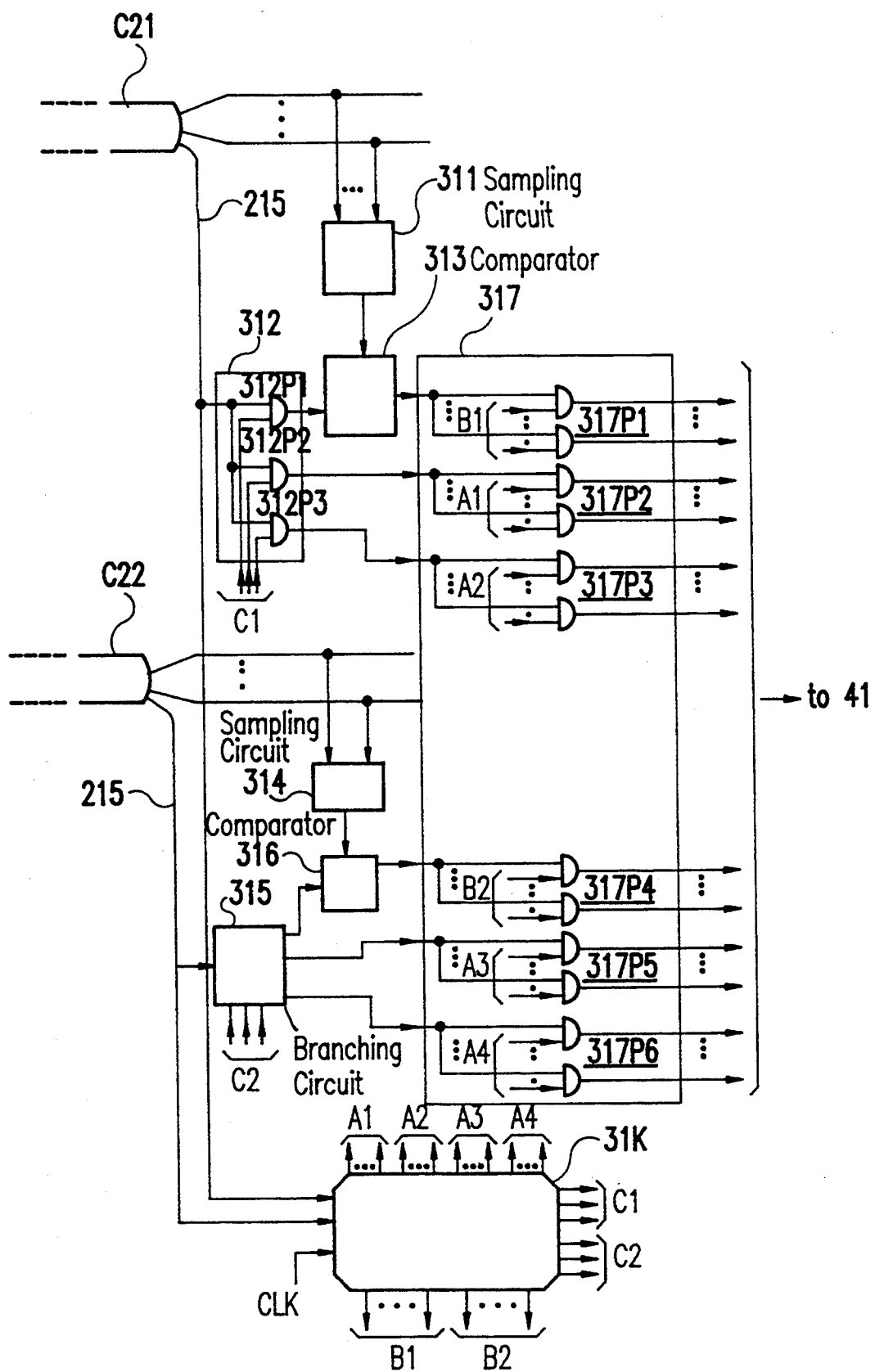
FIG. 5 is a circuit diagram of still another part of the embodiment illustrated in FIG. 1.

Referring next to FIG. 5, which illustrates the circuit configuration of the third level unit 31 in further detail (the sampling circuit 311 and the comparator 313 are merely represented by blocks as they have respectively the same configurations as the corresponding constituent elements of the unit 21), this unit 31 is provided with a synchronization pulse source 31K which is responsive to the frame synchronization signal and the clock pulse supplied via the monitoring cores of the cable C11 and C12 for generating channel pulses A1 through A4, B1 and B2, and C1 and C2. The branching circuit 312 is provided with AND circuits 312P1 through 312P3, each of which receives at one of its input terminals the channel pulses C1 and at the other, the signal from the monitoring core 215 of the cable C21. The outputs of the AND circuits 312P2 and 312P3 respectively match the outputs of the comparator circuits 212 and 214 of the second level unit 21 and, as they are signals indicating the results of the monitoring of the cables C11/C12 and C13/C14, are directly fed to the indicating signal generating circuit 317.

Meanwhile, the output of the AND circuit 312P1, as it comprises the core probe signals and cable probe signal for the cable C21, is compared in the comparator circuit 313 bit by bit with the string of digital signal samples from the sampling circuit 311, and the comparison output is supplied to the converting circuit 317.

The sampling circuit 314, branching circuit 315 and comparator circuit 316 connected to the cable C22 have respectively the same configurations as the above-described circuits 311, 312 and 313, and accordingly their details are dispensed with, but only the channel pulses C2 supplied to the branching circuit 315, corresponding to the channel pulses C1 to the branching circuit 312, are represented in the diagram. The serial-to-parallel converting circuit constituting the indicating signal generating circuit 317 involves a first AND circuit group 317P2 consisting of 50 AND circuits which commonly receive at one of the input terminals of each the output of said AND circuit 312P2 of the branching circuit 312 and at the other terminal the channel pulses A1 (consisting of 50 pulses per frame in mutually staggered positions) from the synchronization pulse source 31K, a second AND circuit group 317P3 consisting of 50 AND circuits which commonly receive at one of the input terminals of each the output of said AND circuit 312P3 of the branching circuit 312 and at the other terminal the channel pulses A2, and a third AND circuit group 317P1 consisting of AND circuits which commonly receive at one of the input terminals of each the output of the comparator circuit 313 and at the other terminal the channel pulses B1.

These AND circuit groups 317P1, 317P2 and 317P3 convert into a space-sharing basis the results of faulty connection monitoring in a time-sharing manner with the core probe signals and cable probe signals supplied via the cables C21, C11 and C12 as stated above, and make it possible to locate the faulty connection with said display unit 41.

The AND circuit groups 317P4, 317P5 and 317P7 which receive at one of the input terminals of each the outputs of the comparator circuit 316 and the branching circuit 315 are responsive to the channel pulses B2, A3 and A4, supplied to the other input terminal, for converting into a space-sharing basis the results of faulty connection monitoring on the cables C22, C13 and C14 above, and make it possible to locate the faulty connection with said display unit.

Figure 6:
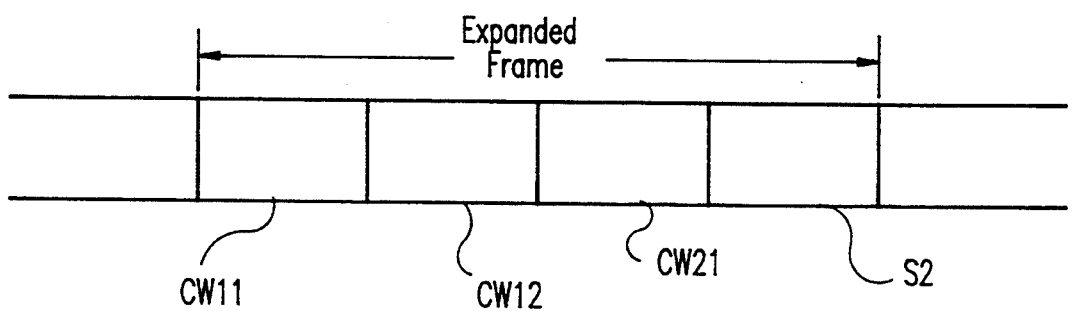
FIG. 6 is a diagram illustrating the frame composition of a signal at another specific point in FIG. 1.

Referring to FIG. 6 illustrating the arrangement of the probe signals and the frame synchronization signal supplied over the monitoring core 215 of the cable C21 on the time axis, these signals consist of the repetition of an expanded frame further comprising the output CW11 of the comparator 212 based on the core probe signals and cable probe signal supplied via the cable C11, the output CW12 of the comparator 214 based on the core probe signals and cable probe signal supplied via the cable C12, the probe signal output CW21 of the cable C21 and a frame synchronization signal S2. This expanded frame configuration is shared by the output signals based on the probe signals for the cables C13, C14 and C22 supplied via the monitoring core of the cable C22, and accordingly the illustration of the expanded frame configurations of these output signals is dispensed with.

The results of faulty connection monitoring supplied to the third level unit 31 as signals converted from these expanded frames in a time-sharing manner is displayed on the display unit 41 as stated above to facilitate the identification of the core or cable having any faulty connection.

In the preferred embodiment of the present invention hitherto described, the number of time slots per frame of the core/cable probe signals, which are time-division multiplexed to be sent out to monitoring cores, can be selected as desired according to the number of cores. Moreover as stated at the beginning of this specification, when cables having gone through continuity testing of the cores are to be used, said generation and transfer of the core probe signals can be dispensed with, and only cable probe signals need to be transferred over monitoring cores. In that case, the core probe signal generating circuit in each unit is unnecessary, and the hardware configuration can be correspondingly simplified. Further, the displaying means of the display unit 41 can combine alarm sounds with visual signs.

Therefore, the technical scope of the invention is not limited to the preferred embodiment and its modifications, but covers all the systems for the detection of faulty cable connection in a communication apparatus as claimed in the following claims.

What is claimed is:

1. A detection system for faulty cable connection in a communication apparatus comprising:
   a casing having a plurality of physically partitioned regions;
   a first functional unit, arranged in a first region within said casing, for generating a first plurality of digital signal;
   a first multicore cable coupled to said first functional unit and comprising a plurality of cable cores; and
   a second functional unit, coupled to said first functional unit by said first multicore cable and arranged in a second region within said casing, for receiving said plurality of digital signals via said plurality of cable cores of said first multicore cable, for detecting any abnormality in the connection of said first multicore cable,
   said first functional unit including:
      means for sending out probe signals of a predetermined waveform over a specific one of the cores of said multicore cable, said specific one of said cores of said multicore cable being a dedicated monitor core for all of the cable cores of said first multicore cable; and
      sampling means for sequentially extracting samples, each of a prescribed duration, of the digital signals on the other cores of the first multicore cable, said monitor core carrying a string of digital signal samples obtained by said sampling means for sequentially extracting samples, and
   said second functional unit including:

means, coupled to said means for sending out probe signals, for determining a presence or absence of identity between said probe signals and a prescribed part of said plurality of digital signals; and means, responsive to the presence or absence of identity between said probe signals and a prescribed part of said plurality of digital signals as determined by said means for determining a presence or absence, for generating a faulty connection indicating signal.

2. A detection system for faulty cable connection in a communication apparatus, as claimed in claim 1, wherein said second functional unit further comprises:

means for generating a string of receive digital signal samples, matching said string of samples, from said plurality of digital signals supplied via said multicore cable; and means for generating, as said faulty connection indicating signal, a signal indicating a discrepancy between said string of receive digital signal samples and said probe signals.

3. A detection system for faulty cable connection in a communication apparatus, as claimed in claim 2, further comprising:

a third functional unit in parallel with said first functional unit and electrically connected to said second functional unit and having a similar function and configuration as said first functional unit and arranged in one of said regions other than said second region, the electrical connection between said third functional unit and said second functional unit including a second multicore cable for transferring a second plurality of digital signals, for detecting any abnormality in the connection of said multicore cable;

said third functional unit comprising:

second sampling means for generating a second string of digital signal samples by sequentially extracting samples, each of a prescribed duration, of said second plurality of digital signals; and means for sending out the string of samples to said second functional unit over a specific one of the cores of said second multicore cable; and said second functional unit comprising:

second means for generating a second string of receive digital signal samples, matching said string of samples, from said second plurality of digital signals supplied via said second multicore cable; and means for generating, as first and second faulty connection indicating signals, signals indicating a discrepancy between said string of receive digital signal samples and said first and second strings of digital signal samples.

4. A detection system for faulty cable connection in a communication apparatus, as claimed in claim 3, further comprising:

a fourth functional unit which receives a third plurality of digital signals from said second functional unit via a third multicore cable;

said second functional unit further comprising:

third sampling means to generate a third string of digital signal samples by sequentially extracting samples, each of a prescribed duration, of said third plurality of digital signals; and means for sending out in a time-sharing manner the output of said third sampling means, together with said first and second faulty connection indicating signals, to a specific one of the cores of said third multicore cable; and said fourth functional unit comprising:

third means for generating a string of receive digital signal samples, matching said string of samples, from said third plurality of digital signals supplied via said third multicore cable;

means for generating a signal indicating discrepancy between said string of receive digital signal samples and said third string of digital signal samples supplied via said third multicore cable; and means for displaying said first and second faulty connection indicating signals and the output signal of said discrepancy indicating signal generating means.

5. A detection system according to claim 1, wherein said second functional unit includes a comparator for performing a comparison to provide a bit-by-bit and cable-by-cable comparison to determine a presence or absence of identity between said probe signals and said prescribed part of said plurality of digital signals.

6. A detection system according to claim 1, wherein said first functional unit includes a core probe signal generating circuit for receiving a supply of said digital signals from all cores of the multicore cable except one core.

7. A detection system according to claim 6, wherein said one core includes the monitor core, said core probe signal generating circuit for extracting a core probe signal by time-division multiplexing said digital signals by scanning them in a prescribed monitor frame with a sampling pulse having a prescribed width.

8. A detection system according to claim 7, further comprising a probe signal inserting circuit for supplying the core probe signal on the monitor core at a prescribed timing.

9. A detection system for faulty cable connection in a communication apparatus comprising:

a plurality of first level units;

a plurality of multicore cables coupled to said plurality of first level units and each comprising a plurality of cable cores;

at least one second level unit, coupled to said plurality of first level units by said plurality of first multicore cables, connected to receive a plurality of digital signals from said plurality of first level units over a respective one of said plurality of multicore cables, each of said plurality of first level units including:

a core probe signal generating circuit for receiving a supply of said digital signals from all cores of the multicore cable except one core, which includes a monitor core, said core probe signal generating circuit including means for extracting a core probe signal by time-division multiplexing said digital signals by scanning them in a prescribed monitor frame with a sampling pulse having a prescribed width, and a probe signal inserting circuit for supplying the core probe signal on the monitor core at a prescribed timing, said second level unit including:

a plurality of sampling circuits connected to respective ones of said plurality of multicore cables for generating a plurality of strings of digital signal samples in the same sequence as that of said core probe signal generating circuits of corresponding first level units by sampling, synchronously with said core probe signal, said plurality of digital signals transferred in parallel over the cores of the multicore cable other than said monitor core, a plurality of comparator circuits for comparing bit-by-bit the strings of digital signal sample from corresponding ones of said sampling circuits with said core probe signal supplied via the monitor core of a corresponding one of said multicore cables, and means, coupled to said plurality of comparator circuits, for generating, as said faulty connection indicating signal, a signal indicating a discrepancy between said strings of receive digital signal samples and said probe signals, wherein said monitor core comprises a dedicated monitor core for all of the cable cores of said respective one of said plurality of multicore cables, said monitor core carrying a string of digital signal samples obtained by said plurality of sampling circuits by sequentially extracting samples, each of a prescribed duration, of the digital signals on the other cores of the respective one of the plurality of multicore cables.

10. The detection system recited in claim 9 further comprising:

a second core probe signal generating circuit for receiving a supply of digital signals from all cores of a further multicore cable except one core, which includes the monitor core for said further multicore cable, said second core probe signal generating circuit extracting a core probe signal by time-division multiplexing said digital signals by scanning them in a prescribed monitor frame with a sampling pulse having a prescribed width, and a second probe signal inserting circuit for sending out on the monitor core of said further multicore cable, in time-division multiplexing manner, outputs of said plurality of comparator circuits for detecting any faulty connection of said plurality of multicore cables and said further multicore cable.

11. The detection system recited in claim 10 further comprising:

a third level unit connected to receive a plurality of digital signals from said further multicore cable, said third level unit including:

a sampling circuit for generating a string of digital signal samples by sampling, synchronously with the core probe signal on said further multicore cable, a plurality of digital signals transferred in parallel from said second level unit, a branching circuit for separating the comparison outputs of said plurality of comparator circuits transferred in a time sharing manner, and a comparator circuit for comparing bit-by-bit core probe signals from the branching circuit and said string of digital signal samples.

12. The detection system recited in claim 11 further comprising:

an indicating signal generating circuit for indicating a detection of any faulty connection core-by-core and cable-by-cable, and a display unit responsive to said indicating signal generating circuit for displaying any faults detected.

* * * * *